(12) United States Patent
Ratnakar Aravind et al.

(10) Patent No.: US 8,610,608 B2
(45) Date of Patent: Dec. 17, 2013

(54) SYSTEMS AND METHODS FOR REDUCED LATENCY LOOP CORRECTION

(75) Inventors: Nayak Ratnakar Aravind, Allentown, PA (US); Scott M. Dziak, Fort Collins, CO (US); Haitao Xia, San Jose, CA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/415,430

(22) Filed: Mar. 8, 2012

(65) Prior Publication Data

US 2013/0238944 A1    Sep. 12, 2013

(51) Int. Cl.
*H03M 1/06*    (2006.01)

(52) U.S. Cl.
USPC .............. 341/118; 360/51; 360/134; 360/46; 360/53

(58) Field of Classification Search
USPC .................. 341/118; 360/51, 134, 46, 53
See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccalissister |
| 6,023,783 A | 2/2000 | Divsalar |
| 6,029,264 A | 2/2000 | Kobayashi |
| 6,065,149 A | 5/2000 | Yamanaka |

(Continued)

OTHER PUBLICATIONS

Casado et al., Multiple-rate low-density parity-check codes with constant blocklength, IEEE Transations on communications, Jan. 2009, vol. 57, pp. 75-83.

(Continued)

*Primary Examiner* — Jean B Jeanglaude
(74) *Attorney, Agent, or Firm* — Hamilton DeSanctis & Cha

(57) ABSTRACT

Various embodiments of the present invention provide systems and methods for data processing. For example, a data processing circuit is discussed that includes: a data detector circuit, a low latency detection circuit, and an error calculation circuit. The data detector circuit is operable to perform a data detection process on a first signal derived from a data input to yield a detected output, and to provide a loop error as a difference between the detected output and the first signal. The low latency detection circuit operable to process a second signal derived from the data input to yield a fast detector output, and to provide a generated error as a difference between the fast detector output and the second signal. The error calculation circuit is operable to calculate an error value based at least in part on the generated error and the loop error.

20 Claims, 4 Drawing Sheets

(56) References Cited

U.S. PATENT DOCUMENTS

| | | | |
|---|---|---|---|
| 6,097,764 | A | 8/2000 | McCallister |
| 6,145,110 | A | 11/2000 | Khayrallah |
| 6,216,249 | B1 | 4/2001 | Bliss |
| 6,216,251 | B1 | 4/2001 | McGinn |
| 6,266,795 | B1 | 7/2001 | Wei |
| 6,317,472 | B1 | 11/2001 | Choi |
| 6,351,832 | B1 | 2/2002 | Wei |
| 6,377,610 | B1 | 4/2002 | Hagenauer |
| 6,381,726 | B1 | 4/2002 | Weng |
| 6,473,878 | B1 | 10/2002 | Wei |
| 6,535,553 | B1 | 3/2003 | Limberg et al. |
| 6,625,775 | B1 | 9/2003 | Kim |
| 6,748,034 | B2 | 6/2004 | Hattori |
| 6,757,862 | B1 | 6/2004 | Marianetti, II |
| 6,785,863 | B2 | 8/2004 | Blankenship |
| 6,810,502 | B2 | 10/2004 | Eidson |
| 6,970,511 | B1 | 11/2005 | Barnette |
| 6,986,098 | B2 | 1/2006 | Poeppelman |
| 7,047,474 | B2 | 5/2006 | Rhee |
| 7,058,873 | B2 | 6/2006 | Song |
| 7,073,118 | B2 | 7/2006 | Greenberg |
| 7,093,179 | B2 | 8/2006 | Shea |
| 7,117,427 | B2 | 10/2006 | Ophir |
| 7,133,228 | B2 | 11/2006 | Fung |
| 7,184,486 | B1 | 2/2007 | Wu |
| 7,191,378 | B2 | 3/2007 | Eroz |
| 7,203,887 | B2 | 4/2007 | Eroz |
| 7,308,061 | B1 | 12/2007 | Huang |
| 7,310,768 | B2 | 12/2007 | Eidson |
| 7,313,750 | B1 | 12/2007 | Feng |
| 7,370,258 | B2 | 5/2008 | Iancu |
| 7,415,651 | B2 | 8/2008 | Argon |
| 7,502,187 | B2* | 3/2009 | Annampedu et al. ........... 360/53 |
| 7,502,189 | B2 | 3/2009 | Sawaguchi |
| 7,523,375 | B2 | 4/2009 | Spencer |
| 7,587,657 | B2 | 9/2009 | Haratsch |
| 7,590,168 | B2 | 9/2009 | Raghavan |
| 7,646,829 | B2 | 1/2010 | Ashley |
| 7,702,986 | B2 | 4/2010 | Bjerke |
| 7,752,523 | B1 | 7/2010 | Chaichanavong |
| 7,779,325 | B2 | 8/2010 | Song |
| 7,802,172 | B2 | 9/2010 | Vila Casado |
| 7,952,824 | B2 | 5/2011 | Dziak |
| 7,958,425 | B2 | 6/2011 | Chugg |
| 7,996,746 | B2 | 8/2011 | Livshitz |
| 8,018,360 | B2 | 9/2011 | Nayak |
| 8,201,051 | B2 | 6/2012 | Tan |
| 8,237,597 | B2 | 8/2012 | Liu |
| 8,261,171 | B2 | 9/2012 | Annampedu |
| 8,291,284 | B2 | 10/2012 | Savin |
| 8,295,001 | B2 | 10/2012 | Liu |
| 2001/0043417 | A1* | 11/2001 | Watanabe et al. ................ 360/51 |
| 2006/0023328 | A1* | 2/2006 | Annampedu ................... 360/46 |
| 2008/0069373 | A1 | 3/2008 | Jiang |
| 2008/0304558 | A1 | 12/2008 | Zhu et al. |
| 2009/0132893 | A1 | 5/2009 | Miyazaki |
| 2009/0185643 | A1 | 7/2009 | Fitzpatrick |
| 2010/0208574 | A1* | 8/2010 | Ratnakar Aravind et al. ............................ 369/134 |
| 2011/0167227 | A1 | 7/2011 | Yang |
| 2011/0264987 | A1 | 10/2011 | Li |
| 2012/0124118 | A1 | 5/2012 | Ivkovic |
| 2012/0182643 | A1 | 7/2012 | Zhang |
| 2012/0207201 | A1 | 8/2012 | Xia |
| 2012/0212849 | A1 | 8/2012 | Xu |
| 2012/0262814 | A1 | 10/2012 | Li |
| 2012/0265488 | A1 | 10/2012 | Sun |

OTHER PUBLICATIONS

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2^m) LDPC Decoders", IEEE Transactions on Circuits and Systemsŝi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/269,852, Unpublished (filed Oct. 10, 2011) (Haitao Xia).

U.S. Appl. No. 13/284,730, Unpublished (filed Oct. 28, 2011) (Fan Zhang).

U.S. Appl. No. 13/295,150, Unpublished (filed Nov. 14, 2011) (Zongwang Li).

U.S. Appl. No. 13/284,767, Unpublished (filed Oct. 28, 2011) (Fan Zhang).

U.S. Appl. No. 13/269,832, Unpublished (filed Oct. 10, 2011) (Haitao Xia).

U.S. Appl. No. 13/227,544, Unpublished (filed Sep. 8, 2011) (Shaohua Yang).

U.S. Appl. No. 13/239,683, Unpublished (filed Sep. 22, 2011) (Changyou Xu).

U.S. Appl. No. 13/186,234, Unpublished (filed Jul. 19, 2011) (Haitao Xia).

U.S. Appl. No. 13/213,751, Unpublished (filed Aug. 19, 2011) (Fan Zhang).

U.S. Appl. No. 13/180,495, Unpublished (filed Jul. 11, 2011) (Chung-Li Wang).

U.S. Appl. No. 13/340,974, Unpublished (filed Dec. 30, 2011) (Dan Liu).

U.S. Appl. No. 13/300,078, Unpublished (filed Nov. 18, 2011) (Chung-Li Wang).

U.S. Appl. No. 13/302,119, Unpublished (filed Nov. 22, 2011) (Lei Chen).

(56) References Cited

OTHER PUBLICATIONS

U.S. Appl. No. 13/305,510, Unpublished (filed Nov. 28, 2011) (Lei Chen).
U.S. Appl. No. 13/227,416, Unpublished (filed Sep. 7, 2011) (Lei Chen).
U.S. Appl. No. 13/305,551, Unpublished (filed Nov. 28, 2011) (Yang Han).
U.S. Appl. No. 13/296,022, Unpublished (filed Nov. 14, 2011) (Victor Krachkovsky).
U.S. Appl. No. 13/174,537, Unpublished (filed Jun. 30, 2011) (Anantha Raman Krishnan).
U.S. Appl. No. 13/174,453, Unpublished (filed Jun. 30, 2011) (Johnson Yen).
U.S. Appl. No. 13/283,549, Unpublished (filed Oct. 27, 2011) (Wu Chang).
U.S. Appl. No. 13/113,219, Unpublished (filed May 23, 2011) (Yang Han).
U.S. Appl. No. 13/327,279, Unpublished (filed Dec. 15, 2011) (Wei Feng).
U.S. Appl. No. 13/316,741, Unpublished (filed Dec. 12, 2011) (Yang Han).
U.S. Appl. No. 13/316,858, Unpublished (filed Dec. 12, 2011) (Zongwang Li).
U.S. Appl. No. 13/362,409, Unpublished (filed Jan. 31, 2012) (Fan Zhang).
U.S. Appl. No. 13/412,520, Unpublished (filed Mar. 5, 2012) (Fan Zhang).
U.S. Appl. No. 13/372,580, Unpublished (filed Feb. 14, 2012) (Fan Zhang).
U.S. Appl. No. 13/171,615, Unpublished (filed Jun. 29, 2011) (Bradley D. Seago).
U.S. Appl. No. 13/340,951, Unpublished (filed Dec. 30, 2011) (Lei Chen).
U.S. Appl. No. 13/369,468, Unpublished (filed Feb. 9, 2012) (Zongwang Li).
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VLSI Implementation", IEEE Transactions on Magnetics, v. 43, pp. 1118-1123, Mar. 2007.
Zhong, "Block-LDPC: A Practical LDPC Coding System Design Approach", IEEE Trans. on Circuits, Regular Papers, vol. 5, No. 4, pp. 766-775, Apr. 2005.

\* cited by examiner

SYSTEMS AND METHODS FOR REDUCED LATENCY LOOP CORRECTION

BACKGROUND OF THE INVENTION

The present inventions are related to systems and methods for data processing, and more particularly to systems and methods for loop based error compensation.

Various data processing circuits have been developed that include one or more loops. For example, a data processing circuit may receive a data signal that repeats at a defined frequency. In some cases, such loops are adjusting multiple modifiable parameters together. This can result in loop oscillation and/or improper loop operation.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for loop based error compensation.

Various embodiments of the present invention provide data processing systems that include: a data detector circuit, a low latency detection circuit, and an error calculation circuit. The data detector circuit is operable to perform a data detection process on a first signal derived from a data input to yield a detected output, and to provide a loop error as a difference between the detected output and the first signal. The low latency detection circuit operable to process a second signal derived from the data input to yield a fast detector output, and to provide a generated error as a difference between the fast detector output and the second signal. The error calculation circuit is operable to calculate an error value based at least in part on the generated error and the loop error. In some cases, the data processing system is implemented as part of an integrated circuit. In various cases, the data processing system is incorporated in a storage device, or a data transmission device. In some instances of the aforementioned embodiments, the low latency detection circuit is an envelope detector circuit.

In some instances of the aforementioned embodiments, the data processing system further includes an equalizer circuit operable to equalized a third signal derived from the data input to yield an equalized output. In such cases, the first signal is derived from the equalized output, and the second signal may be selected from either the equalized output or the third signal. In some such instances, the data processing system further includes a summation circuit operable to subtract the error value from the data input to yield a corrected input, and an analog processing circuit operable to generate a series of digital values corresponding to the third signal from the corrected input.

In various instances of the aforementioned embodiments, the error calculation circuit includes: a first delay circuit operable to delay the generated error to yield a first delayed output; a first summation circuit operable to add the loop error, the generated error, and a negative of the first delayed output to yield a first sum; a second delay circuit operable to delay an interim offset value to yield a second delayed output; a second summation circuit operable to subtract the second delayed output from an offset input derived from the first sum to yield a second sum; and a register operable to store the second sum as the interim offset value. In such instances, the error value is derived from the interim offset value. In some such instances, the data processing system further includes a multiplier circuit operable to multiply the first sum by a scalar value to yield the offset input.

In other instances of the aforementioned embodiments, the error calculation circuit includes: a first delay circuit operable to delay the generated error to yield a first delayed output; a first summation circuit operable to add the loop error, the generated error, and a negative of the first delayed output to yield a first sum; an absolute value circuit operable to generate an absolute value of the first sum; a multiplier circuit operable to multiply the first sum by the absolute value of the first sum to yield a product; a second delay circuit operable to delay an interim offset value to yield a second delayed output; a second summation circuit operable to subtract the second delayed output from an offset input derived from the product to yield a second sum; and a register operable to store the second sum as the interim offset value, In such instances, the error value is derived from the interim offset value. In some such instances, the multiplier circuit is a first multiplier circuit, and the data processing system further includes a second multiplier circuit operable to multiply the product by a scalar value to yield the offset input. In particular cases, the data processing system is further operable to scale a multiplier value by the product.

In yet other instances of the aforementioned embodiments, the error calculation circuit includes: a first absolute value circuit operable to generate an absolute value of the generated error; a first multiplier circuit operable to multiply the generated error by the absolute value of the generated error to yield a first product; a second absolute value circuit operable to generate an absolute value of the loop error; a second multiplier circuit operable to multiply the loop error by the absolute value of the loop error to yield a second product; a first delay circuit operable to delay the first product to yield a first delayed output; a first summation circuit operable to add the first product, the second product, and a negative of the first delayed output to yield a first sum; a second delay circuit operable to delay an interim offset value to yield a second delayed output; a second summation circuit operable to subtract the second delayed output from an offset input derived from the first sum to yield a second sum; and a register operable to store the second sum as the interim offset value, In such instances, the error value is derived from the interim offset value. In some such instances, the error calculation circuit further includes a third multiplier circuit operable to multiply the first sum product by a scalar value to yield the offset input.

Other embodiments of the present invention provide methods for low latency loop correction. Such methods include: receiving a data input; applying a first data detection algorithm to a first signal derived from a data input to yield a detected output; calculating a difference between the first signal and the detected output to yield a loop error; applying a second data detection algorithm to a second signal derived from the data input to yield a fast detector output; calculating a difference between the second signal and the fast detector output to yield a generated error; and calculating an error value based at least in part on the generated error and the loop error. The latency of the second data detection algorithm is less than a latency of the first data detection algorithm.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for loop based error compensation.

Various embodiments of the present invention provide data processing circuits that include front end loops with reduced latency error correction with subsequent increased latency error correction allowing for a low latency roughly estimated error correction followed by a subsequent, more accurate high latency error correction. This approach allows for a relatively quick error correction followed by a correction of the original error correction once additional, more accurate information is available.

Figure 1:
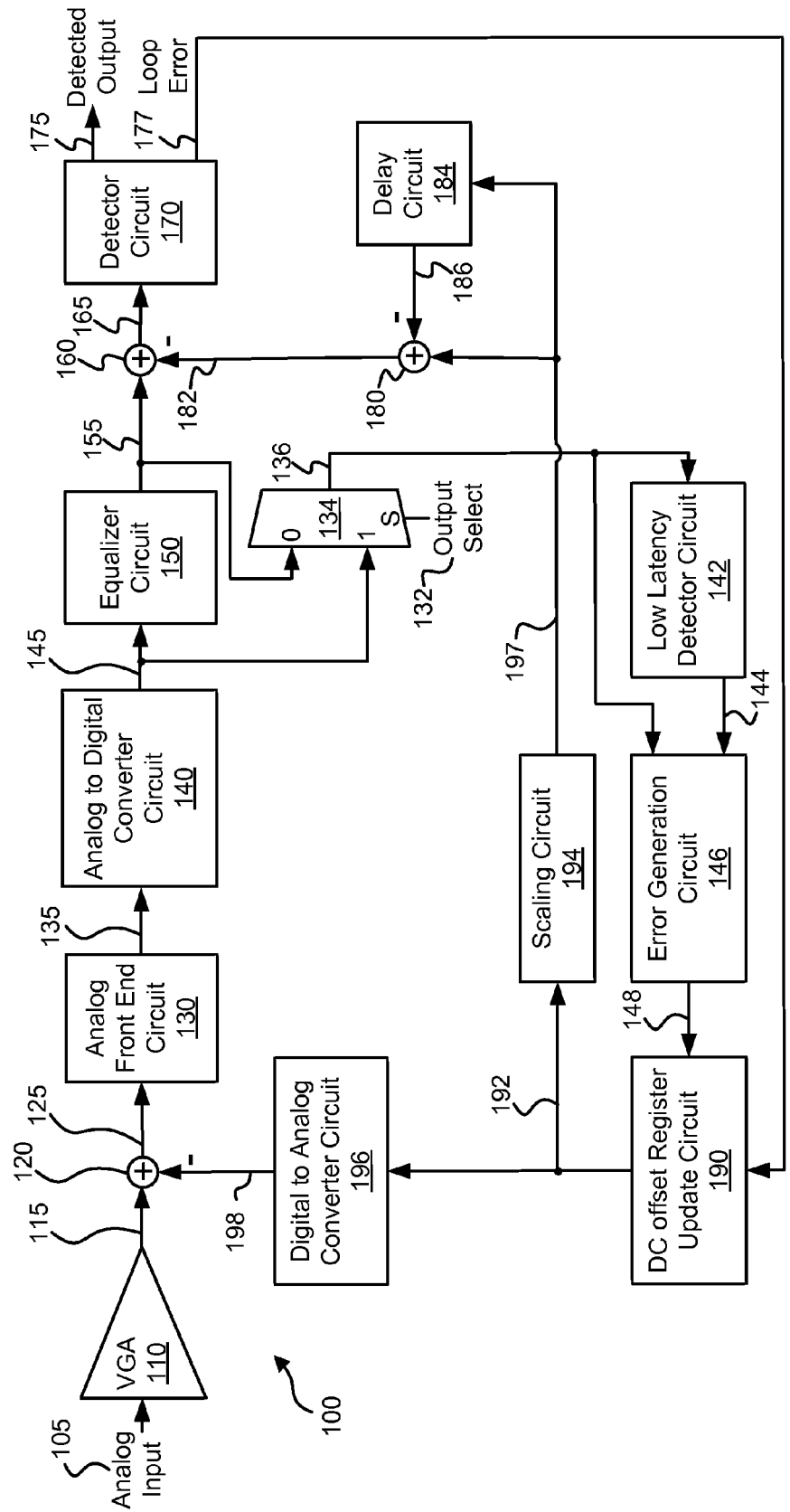
FIG. 1 depicts a reduced latency loop correction circuit in accordance with one or more embodiments of the present invention.

Turning to FIG. 1, a reduced latency loop correction circuit 100 is shown in accordance with one or more embodiments of the present invention. Reduced latency loop correction circuit 100 includes a variable gain amplifier 110 that receives an analog input 105. Variable gain amplifier 110 may be any circuit known in the art that is capable of amplifying a received signal by a gain that can be changed. Based upon the disclosure provided herein, one of ordinary skill in the art will recognize a variety of circuits that may be used to implement variable gain amplifier 110. Analog input 105 may be any analog signal carrying information to be processed. In some embodiments of the present invention, analog input 105 is derived from a storage medium. In other embodiments of the present invention, analog input 105 is derived from a communication device receiving information from a communication medium. Based upon the disclosure provided herein, one of ordinary skill in the art will recognize a variety of analog signals and/or sources thereof that may be used in relation to different embodiments of the present invention. Variable gain amplifier 110 amplifies analog input 105 to yield an amplified output 115 that is provided to a summation circuit 120. Summation circuit 120 subtracts an analog DC offset 198 from amplified output 115 to yield a sum 125.

Sum 125 is provided to an analog front end circuit 130 operable to massage a received analog signal to yield a processed analog signal 135. In some cases, analog front end circuit 130 includes an analog filter circuit. Based upon the disclosure provided herein, one of ordinary skill in the art will recognize a variety of circuits included as part of analog front end circuit 130. Processed analog signal 135 is provided to an analog to digital converter circuit 140. Analog to digital converter circuit 140 may be any circuit known in the art that is capable of converting an analog signal into a series of digital values representing the received analog signal. Analog to digital converter circuit 140 converts the received signal (processed analog signal 135) into a series of digital samples 145 that are provided to an equalizer circuit 150. Equalizer circuit 150 may be any circuit known in the art for equalizing a digital signal. Equalizer circuit 150 equalizes the received input (digital samples 145) and provides a corresponding equalized output 155 to a summation circuit 160. Summation circuit 160 subtracts a corrected output 182 from equalized output 155 to yield a detector input 165.

Detector input 165 is provided to a detector circuit 170. Detector circuit 170 applies a data detection algorithm to the detector input 165 to yield a detected output 175. In some embodiments of the present invention, detector circuit 170 is a Viterbi algorithm data detector circuit or a maximum a posteriori data detector circuit as are known in the art. Based upon the disclosure provided herein, one of ordinary skill in the art will recognize a variety of data detector circuits that may be used in relation to different embodiments of the present invention. Detected output 175 may be provided to a downstream processor (not shown) that performs additional processing on the output. Based upon the disclosure provided herein, one of ordinary skill in the art will recognize a variety of downstream processors that may received detected output 175. In addition, detector circuit 170 calculates a loop error 177 that is provided to a DC offset register update circuit 190. Loop error 177 is calculated by subtracting corresponding instances of detector input 165 from detected output 175 as shown in the following equation:

$$\text{Loop Error}_i 177 = \text{Detected Output}_i 175 - \text{Detector Input}_i 165.$$

A selector circuit 134 selects between digital samples 145 and equalized output 155 as an interim output 136 based upon an output select 132. Selector circuit 134 may be any circuit known in the art that is capable of selecting one or two inputs to be provided as an output signal. In one particular embodiment of the present invention, selector circuit 134 is a multiplexer circuit. In particular, selector circuit 134 provides digital samples 145 as interim output 136 when output select input 132 is asserted as a logic '1', and provides equalized output 155 as interim output 136 when output select input 132 is asserted as a logic '0'. Output select input 132 may be a user programmable input, or may be hardwired to always select one input or the other.

Interim output 136 is provided to a low latency detector circuit 142. Low latency detector circuit 142 operates to provide a reasonable approximation of detected output 175 while not requiring the processing time of detector circuit 170. Of note, low latency detector circuit 142 may not provide the accuracy of detector circuit 175, but the effect of any errors is limited by the feedback loop. Low latency detector circuit 142 may be any circuit capable of providing an estimate of detected output 175 faster than detected output 175 is available. An example implementation of an envelope detector based circuit that may be used in relation to low latency detector circuit 142 is discussed below in relation to FIG. 3. In other cases, low latency detector circuit 142 may be implemented similar to the detector mimicking circuit discussed in U.S. patent application Ser. No. 12/887,369 entitled "Systems and Methods for Low Latency Noise Cancellation", and filed Sep. 21, 2010 by Liu et al. The entirety of the aforementioned patent application is incorporated herein by reference for all purposes. Low latency detector circuit 142 provides a fast detector output 144 to an error generation circuit 146. Error generation circuit 146 calculates a generated error 148 by subtracting corresponding instances of interim output 136 from fast detected output 144 as shown in the following equation:

Generated Output$_i$ 148=Fast Detected Output$_i$ 144−Interim Output$_i$ 136.

Figure 2A:
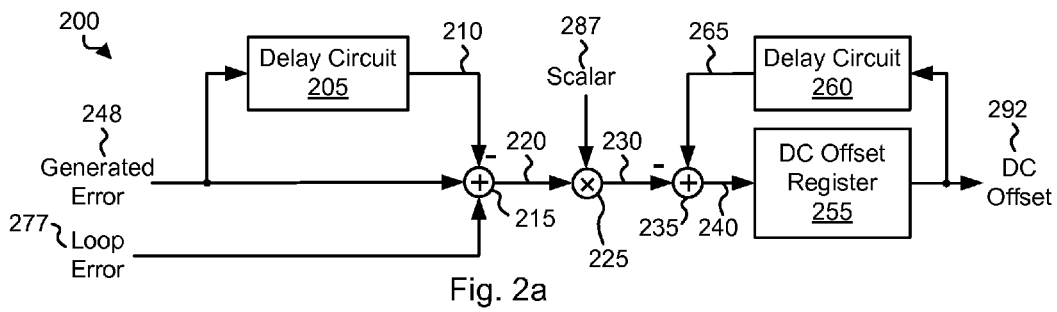
FIG. 2a depicts a DC offset register update circuit that may be used as part of the reduced latency loop correction circuit of FIG. 1 in accordance with one or more embodiments of the present invention.
Figure 2B:
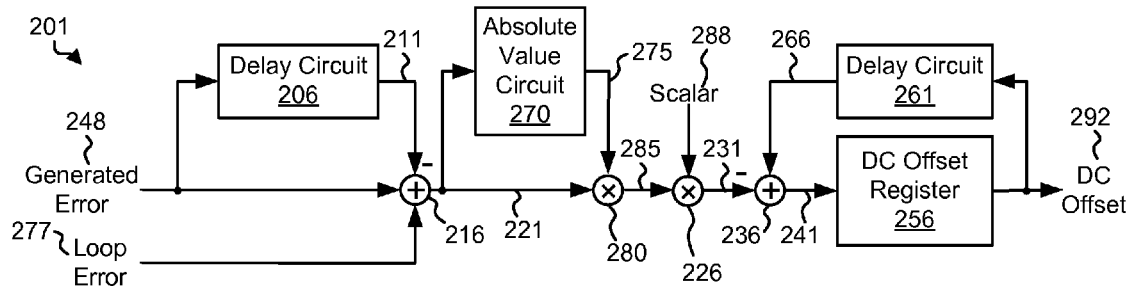
FIG. 2b depicts another DC offset register update circuit that may be used as part of the reduced latency loop correction circuit of FIG. 1 in accordance with other embodiments of the present invention.
Figure 2C:
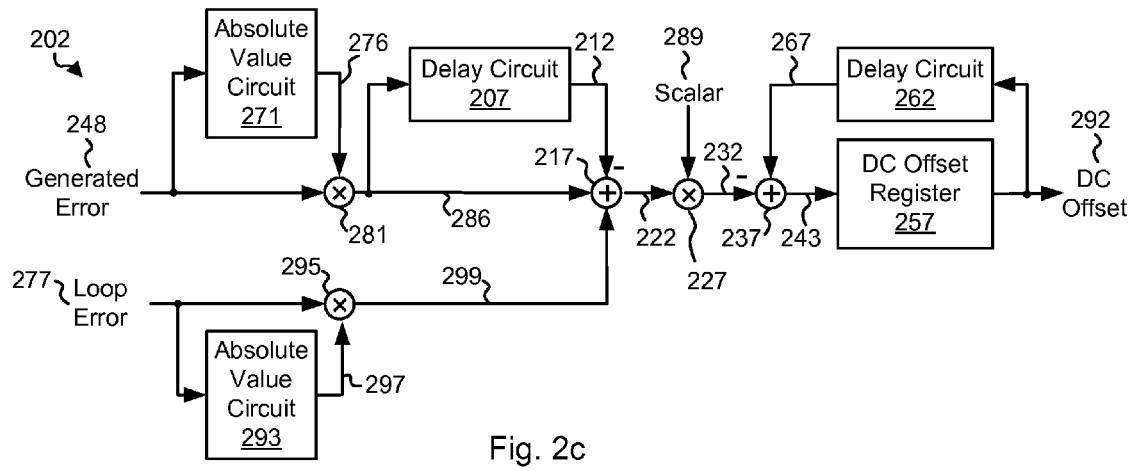
FIG. 2c depicts yet another DC offset register update circuit that may be used as part of the reduced latency loop correction circuit of FIG. 1 in accordance with yet other embodiments of the present invention.

Generated output 148 is provided to DC offset register update circuit 190. DC offset register update circuit 190 is operable to generate a DC offset based upon a combination of generated error output 148 and loop error 177. FIGS. 2a-2c below provide example implementations of DC offset register update circuit 190 in accordance with different embodiments of the present invention. In some cases, DC offset register update circuit 190 uses squared error values that retain the sign of the error value to update DC offset 192. Such an approach yields increased loop response speed with lower adaptation noise than that possible with a conventional linear update approach relying on linear scaled version of error values.

DC offset 192 is provided to a scaling circuit 194 that scales DC offset 192 to yield a scaled output 197. DC offset 192 is multiplied by a scaling factor which matches any amplification caused by analog front end circuit 130, analog to digital converter circuit 140 and, where equalized output 155 is selected as interim output 136, equalizer circuit 150. Scaled output 197 is provided to a summation circuit 180 and a delay circuit 184. Delay circuit 184 delays scaled output 197 by a number of clock cycles corresponding to the difference in latency between detector circuit 170 and low latency detector circuit 142, and the delayed signal is provided as a delayed value 186. Summation circuit 180 subtracts delayed value 186 from scaled output 197 to yield corrected output 182. By doing this, scaled value 197 initially reacts to generated error 148 that exhibits low latency and is subsequently reacts to loop error 177 when it becomes available. DC offset 192 is provided to a digital to analog converter circuit 196. Digital to analog converter circuit 196 converts the received input to analog DC offset 198.

Turning to FIG. 2a, a DC offset register update circuit 200 is shown that may be used as part of the reduced latency loop correction circuit of FIG. 1 in accordance with one or more embodiments of the present invention. Where DC offset register update circuit 200 is used in place of DC offset register update circuit 190 of FIG. 1, a generated error 248 corresponds to generated error 148, a loop error 277 corresponds to loop error 177, and a DC offset 292 corresponds to DC offset 192. Generated error 248 is provided to a delay circuit 205. Delay circuit 205 delays generated output 248 to yield a delayed output 210. The amount of delay corresponds to the difference between the latency required to pass through data detector circuit 170 and low latency data detector circuit 142. Generated error 248, loop error 277 and delayed output 210 are all provided to a summation circuit 215. Summation circuit 215 adds generated error 248 to loop error 277 to yield an interim sum, and subtracts delayed output 210 from the interim sum to yield a sum output 220 in accordance with the following equation:

Sum Output 220=Loop Error 277+Generated Error 248−Delayed Output 210.

Sum output 220 is multiplied by a scalar 287 by a multiplier circuit 225 to yield a product 230. Product 230 is subtracted by a summation circuit 235 from a delayed output 265 that is a delayed version of DC offset 292. The delay is applied by a delay circuit 260 which delays DC offset 292 by a number of clock cycles corresponding to the delay through low latency detector circuit 142. Summation circuit 235 provides a sum output 240 in accordance with the following equation:

Sum Output 240=Delayed Output 265−Product 230.

Sum output 240 is then stored to a DC offset register 255. The currently stored value of DC offset register 255 is provided as DC offset 292.

DC offset register update circuit 200 operates in accordance with the following equation:

DC Offset$_k$ 292=DC Offset$_{k-1}$ 292+(Scalar 287)[$\hat{e}_{k-D1}$+($e_{k-D2}$−$\hat{e}_{k-D2}$)], where:

$\hat{e}_k$=Ideal Output$_k$−Generated Error$_k$ 248;

$e_k$=Ideal Output$_k$−Loop Error$_k$ 277; and

D1 is equal the delay through delay circuit 260, and D2 is equal to the delay through delay circuit 205. In one particular embodiment of the present invention, D1 is 4 T and D2 is 50 T. The aforementioned process can be represented by the following hardware implementable equation:

$$DC\ Offset_k 292 = (Scalar\ 287)\left[\sum_{j=k-D2+1}^{k-D1} \hat{e}_j - \sum_{j=0}^{k-D2} e_j\right].$$

In effect the correction implemented by the $$\sum_{j=k-D2+1}^{k-D1} \hat{e}_j$$

is implemented in a low latency, and once the longer latency correction information, $$\sum_{j=0}^{k-D2} e_j,$$

is available it is swapped out for the initial low latency correction.

Turning to FIG. 2b, another DC offset register update circuit 201 is shown that may be used as part of the reduced latency loop correction circuit of FIG. 1 in accordance with one or more embodiments of the present invention. Where DC offset register update circuit 201 is used in place of DC offset register update circuit 190 of FIG. 1, generated error 248 corresponds to generated error 148, loop error 277 corresponds to loop error 177, and DC offset 292 corresponds to DC offset 192. Generated error 248 is provided to a delay circuit 206. Delay circuit 206 delays generated output 248 to yield a delayed output 211. The amount of delay corresponds to the difference between the latency required to pass through data detector circuit 170 and low latency data detector circuit 142. Generated error 248, loop error 277 and delayed output 211 are all provided to a summation circuit 216. Summation circuit 216 adds generated error 248 to loop error 277 to yield an interim sum, and subtracts delayed output 211 from the interim sum to yield a sum output 221 in accordance with the following equation:

Sum Output 221=Loop Error 277+Generated Error 248−Delayed Output 211.

Sum output 221 is provided to an absolute value circuit 270 that provides an absolute value 275 of sum output 221. A multiplier circuit 280 multiplies sum output 221 by absolute value 275 to yield a signed squared output 285. Signed squared output 285 is multiplied by a scalar 288 by a multiplier circuit 226 to yield a product 231. Product 231 is subtracted by a summation circuit 236 from a delayed output 266 that is a delayed version of DC offset 292. The delay is applied by a delay circuit 261 which delays DC offset 292 by a number of clock cycles corresponding to the delay through low latency detector circuit 142. Summation circuit 236 provides a sum output 241 in accordance with the following equation:

Sum Output 241=Delayed Output 266−Signed Squared Output 285.

Sum output 241 is then stored to a DC offset register 256. The currently stored value of DC offset register 256 is provided as DC offset 292.

DC offset register update circuit 201 operates in accordance with the following equation:

DC Offset$_k$ 292=DC Offset$_{k-1}$ 292+(Scalar 288)[$e_k^{dc}$*|$e_k^{dc}$|], where:

ê$_k$=Ideal Output$_k$−Generated Error$_k$ 248;

e$_k$=Ideal Output$_k$−Loop Error$_k$ 277;

e$_k^{dc}$=ê$_{k-D1}$+(e$_{k-D2}$−ê$_{k-D2}$); and

D1 is equal the delay through delay circuit 261, and D2 is equal to the delay through delay circuit 206. In some cases, scalar 288 is scaled by the absolute value of e$_k^{dc}$ so that the update is slow when the error term is small in magnitude, and is high when the error term is large in magnitude. This results in a fast but noisy response when the error term is large in magnitude, and a relatively noiseless but slow response when the error term is small in magnitude.

Turning to FIG. 2c, yet another DC offset register update circuit 202 is shown that may be used as part of the reduced latency loop correction circuit of FIG. 1 in accordance with one or more embodiments of the present invention. Where DC offset register update circuit 202 is used in place of DC offset register update circuit 190 of FIG. 1, generated error 248 corresponds to generated error 148, loop error 277 corresponds to loop error 177, and DC offset 292 corresponds to DC offset 192. Generated error 248 is provided to an absolute value circuit 271 that provides an absolute value 276 of generated error 248. A multiplier circuit 281 multiplies generated error 248 by absolute value 276 to yield a signed squared output 286. Signed squared output 286 is provided to a delay circuit 207. Delay circuit 207 delays signed squared output 286 to yield a delayed output 212. The amount of delay corresponds to the difference between the latency required to pass through data detector circuit 170 and low latency data detector circuit 142. Loop error 277 is provided to an absolute value circuit 293 that provides an absolute value 297 of loop error 277. A multiplier circuit 295 multiplies loop error 277 by absolute value 297 to yield a signed squared output 299. Signed squared output 299, signed squared output 286 and delayed output 212 are all provided to a summation circuit 217. Summation circuit 217 adds signed squared output 299 to signed squared output 286 to yield an interim sum, and subtracts delayed output 212 from the interim sum to yield a sum output 222 in accordance with the following equation:

Sum Output 222=Sign Squared Output 286+Sign Squared Output 299−Delayed Output 212.

Sum output 222 is multiplied by a scalar 289 by a multiplier circuit 227 to yield a product 232. Product 232 is subtracted by a summation circuit 237 from a delayed output 267 that is a delayed version of DC offset 292. The delay is applied by a delay circuit 262 which delays DC offset 292 by a number of clock cycles corresponding to the delay through low latency detector circuit 142. Summation circuit 237 provides a sum output 243 in accordance with the following equation:

Sum Output 243=Delayed Output 267−Product 232.

Sum output 242 is then stored to a DC offset register 257. The currently stored value of DC offset register 257 is provided as DC offset 292.

DC offset register update circuit 200 operates in accordance with the following equation:

DC Offset$_k$ 292=DC Offset$_{k-1}$ 292+(Scalar 289)[$e_k^{dc}$], where:

ê$_k$=Ideal Output$_k$−Generated Error$_k$ 248;

e$_k$=Ideal Output$_k$−Loop Error$_k$ 277;

$e_k^{dc}$=ê$_{k-D1}$*|ê$_{k-D1}$|+[(e$_{k-D2}$*|e$_{k-D2}$|)−(ê$_{k-D2}$*|ê$_{k-D2}$|)]; and D1 is equal the delay through delay circuit 262, and D2 is equal to the delay through delay circuit 207. In one particular embodiment of the present invention, D1 is 4 T and D2 is 50 T. The aforementioned process can be represented by the following hardware implementable equation:

$$DC\ \text{Offset}_k 292 = (\text{Scalar } 289)\left[\sum_{j=k-D2+1}^{k-D1} \hat{e}_j^*|\hat{e}_j| - \sum_{j=0}^{k-D2} e_j^*|e_j|\right].$$

In effect the correction implemented by the $$\sum_{j=k-D2+1}^{k-D1} \hat{e}_j^*|\hat{e}_j|$$

is implemented in a low latency, and once the longer latency correction information, $$\sum_{j=0}^{k-D2} e_j^* |e_j|,$$

is available it is swapped out for the initial low latency correction.

Figure 3:
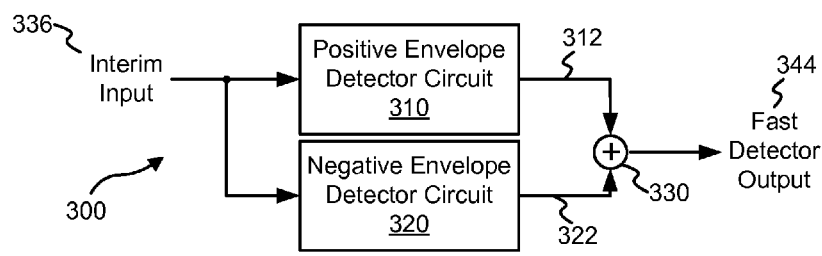
FIG. 3 depicts a low latency detector circuit that may be used as part of the reduced latency loop correction circuit of FIG. 1 in accordance with some embodiments of the present invention.

FIG. 3 depicts a low latency detector circuit 300 that may be used in place of low latency detector circuit 142 of FIG. 1 in accordance with some embodiments of the present invention. Where low latency detector circuit 300 is used in place of low latency detector circuit 142 of FIG. 1, interim input 336 corresponds to interim output 136, and fast detector output 344 corresponds to fast detector output 144. Interim input 144 is provided to both a positive envelope detector circuit 310 that generates a positive output 312, and a negative envelope detector circuit 320 that generates a negative output 322. Positive output 312 is generated in accordance with the following equation:

Positive Output$_{k+1}$ 312=Max[Interim Output$_{k+1}$ 336, Positive Output$_k$ 312−Δ], where Max[ ] represents a comparison of Interim output 336 and (positive output 312−Δ) with the largest of the two being selected as the output. The value of delta may be user programmable. Negative output 322 is generated in accordance with the following equation:

Negative Output$_{k+1}$ 322=Min[Interim Output$_{k+1}$ 336, Negative Output$_k$ 322+Δ], where Min[ ] represents a comparison of Interim output 336 and (negative output 312+Δ) with the smallest of the two being selected as the output. The value of delta may be user programmable. Positive output 312 is added to negative output 322 by a summation circuit 330 to yield fast detector output 344.

Figure 4:
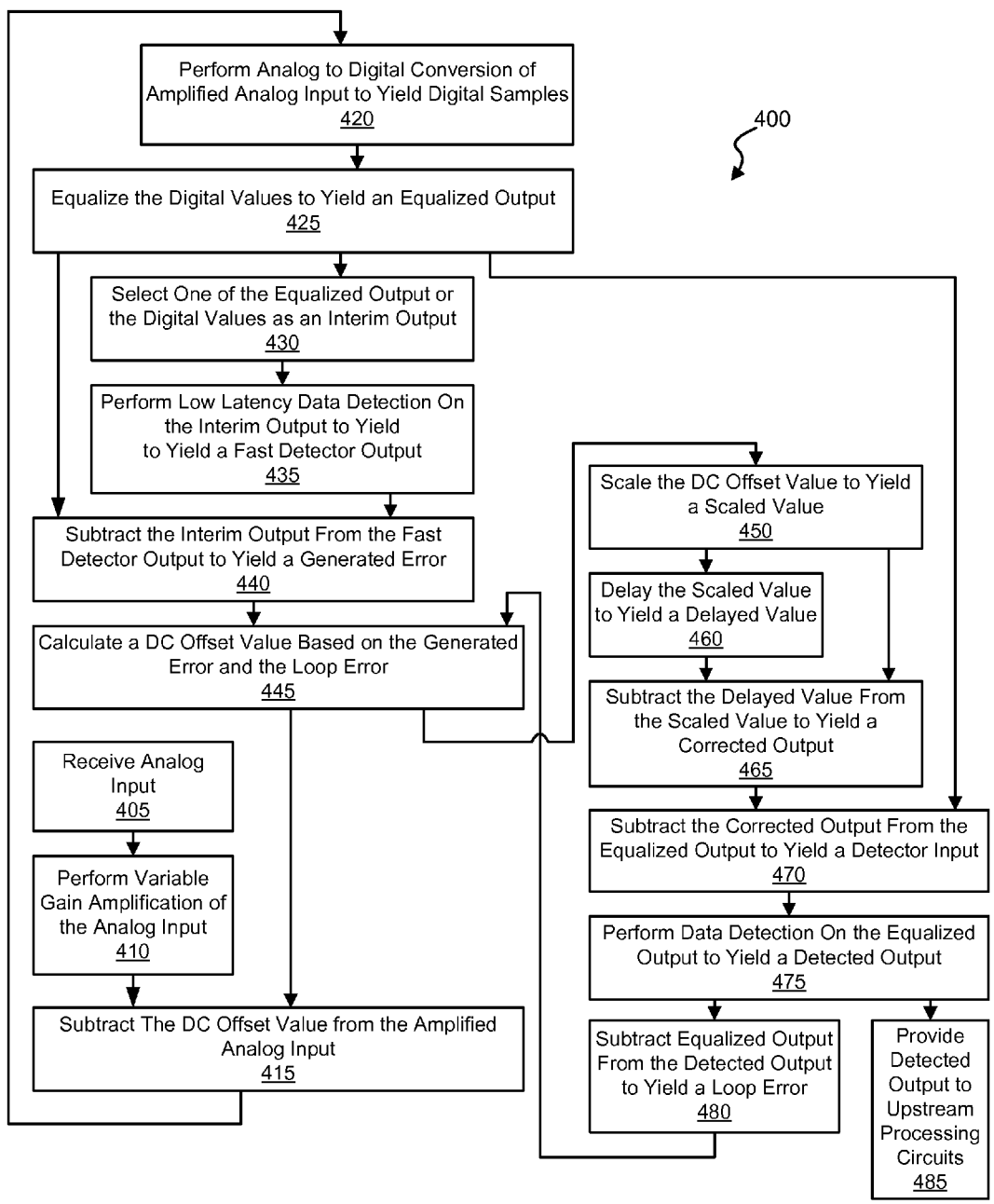
FIG. 4 is a flow diagram showing a method for reduced latency feedback correction in accordance with various embodiments of the present invention.

Turning to FIG. 4, a flow diagram 400 shows a method for reduced latency feedback correction in accordance with various embodiments of the present invention. Following flow diagram 400, an analog input is received (block 405). The received analog input may be any analog signal carrying information to be processed. In some embodiments of the present invention, the analog input is derived from a storage medium. In other embodiments of the present invention, the analog input is derived from a transmission device. Based upon the disclosure provided herein, one of ordinary skill in the art will recognize a variety of analog signals and/or sources thereof that may be used in relation to different embodiments of the present invention. A variable gain amplification is applied to the received analog input to yield an amplified output (block 410).

An analog DC offset is subtracted from the amplified analog input to yield a sum (block 415), and an analog to digital conversion is applied to the sum yielding a series of digital values (block 415). The digital values are equalized to yield an equalized output (block 425). One of the digital values (block 420) or the digital samples (block 425) are selected as an interim output (block 430). A low latency data detection is applied to the interim output to yield a fast detector output (block 435). The low latency data detection may be any data detection process known in the art that is capable of providing an estimate of detected output faster than the actual detected output is available. An example implementation of an envelope based data detection process that may be used in relation to low latency detection process is discussed above in relation to FIG. 3. In other cases, the low latency data detection may be implemented similar to the detector mimicking circuit discussed in U.S. patent application Ser. No. 12/887,369 entitled "Systems and Methods for Low Latency Noise Cancellation", and filed Sep. 21, 2010 by Liu et al. Based upon the disclosure provided herein, one of ordinary skill in the art will recognize other low latency data detection processes that may be used in relation to different embodiments of the present invention. The interim output is subtracted from the fast detector output to yield a generated error (block 440).

As more fully explained below, a DC offset value is calculated based upon the generated error and a loop error (block 445). The DC offset value is converted from a digital signal to an analog signal to yield the analog DC offset used in block 415. The DC offset may be calculated in accordance with any of the approaches described above in relation to FIGS. 2a-2c. The DC offset is scaled by multiplication of a scalar value to yield a scaled value (block 450). The scaled value is delayed by a time corresponding to the difference between the latency through the low latency detection of block 435 and the data detection of block 475 (block 460). The resulting output is referred to as a delayed output. The delayed output (block 460) is subtracted from the scaled value (block 465) to yield a corrected output (block 465). The corrected output is subtracted from the equalized output to yield a detector input (block 470). A data detection process is then applied to the detector input that yields a detected output (block 475). The data detection process may be any data detection process known in the art including, but not limited to, a maximum a posteriori data detection process or a Viterbi algorithm data detection process. The result of the detection process is provided as a detected output to one or more upstream processing circuits such as, for example, a low density parity check decoder circuit (block 485). In addition, the detected output is subtracted from the equalized output to yield the loop error used in block 445 (block 480).

Figure 5:
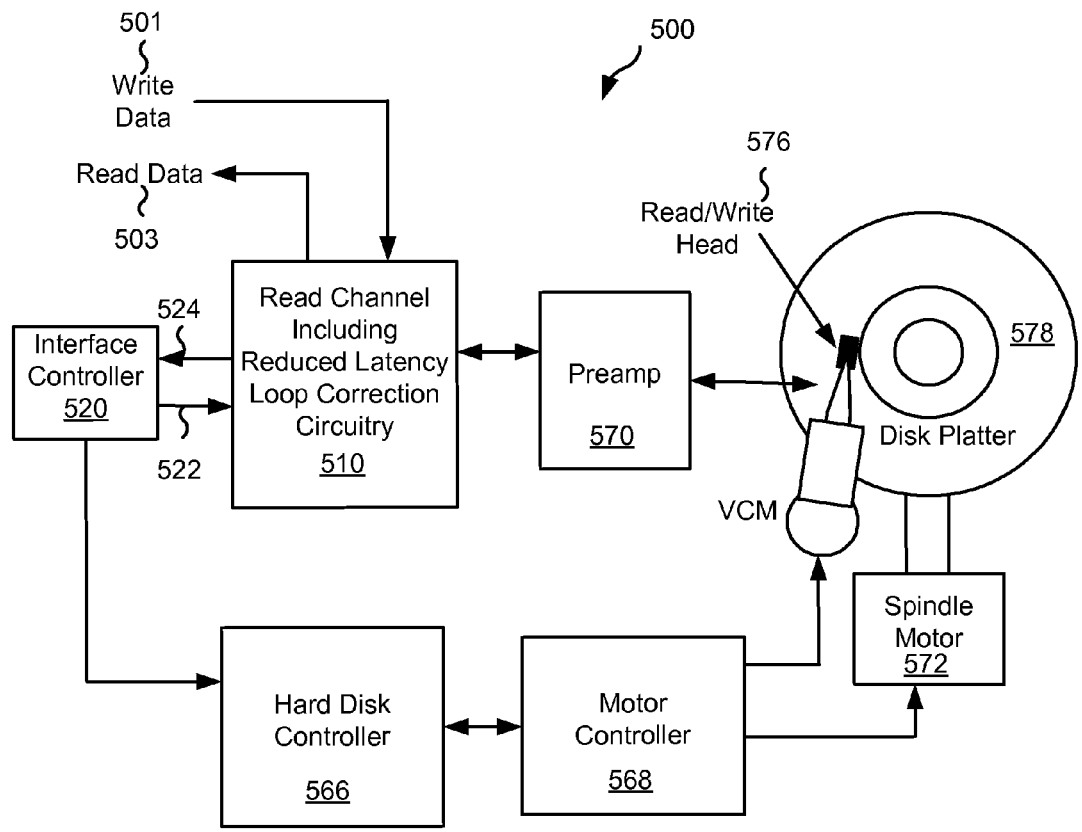
FIG. 5 shows a storage system including a read channel circuit having reduced latency loop correction circuitry in accordance with some embodiments of the present invention.

Turning to FIG. 5, a storage system 500 is shown that includes a read channel circuit having reduced latency loop correction circuitry in accordance with some embodiments of the present invention. The reduced latency loop correction circuit may drive a data signal to a data processing circuit including, but not limited to, a data detector circuit and a data decoder circuit. In some cases, the data decoder circuit may be a low density parity check decoder circuit. Storage system 500 may be, for example, a hard disk drive. Storage system 500 also includes a preamplifier 570, an interface controller 520, a hard disk controller 566, a motor controller 568, a spindle motor 572, a disk platter 578, and a read/write head assembly 576. Interface controller 520 controls addressing and timing of data to/from disk platter 578. The data on disk platter 578 consists of groups of magnetic signals that may be detected by read/write head assembly 576 when the assembly is properly positioned over disk platter 578. In one embodiment, disk platter 578 includes magnetic signals recorded in accordance with either a longitudinal or a perpendicular recording scheme.

In a typical read operation, read/write head assembly 576 is accurately positioned by motor controller 568 over a desired data track on disk platter 578. Motor controller 568 both positions read/write head assembly 576 in relation to disk platter 578 and drives spindle motor 572 by moving read/write head assembly to the proper data track on disk platter 578 under the direction of hard disk controller 566. Spindle motor 572 spins disk platter 578 at a determined spin rate (RPMs). Once read/write head assembly 578 is positioned adjacent the proper data track, magnetic signals representing data on disk platter 578 are sensed by read/write head assembly 576 as disk platter 578 is rotated by spindle motor 572. The sensed magnetic signals are provided as a continuous, minute analog signal representative of the magnetic data on disk platter 578. This minute analog signal is transferred from read/write head assembly 576 to read channel circuit 510 via preamplifier 570. Preamplifier 570 is operable to amplify the minute analog signals accessed from disk platter 578. In turn, read channel circuit 510 decodes and digitizes the received analog signal to recreate the information originally written to disk platter 578. This data is provided as read data 503 to a receiving circuit. As part of decoding the received information, read channel circuit 510 processes the received signal using a reduced latency loop correction circuit. Such a reduced latency loop correction circuit may be implemented consistent with that described above in relation to FIGS. 1-3. In some cases, the reduced latency loop correction may be done consistent with the flow diagram discussed above in relation to FIG. 4. A write operation is substantially the opposite of the preceding read operation with write data 501 being provided to read channel circuit 510. This data is then encoded and written to disk platter 578.

It should be noted that storage system 500 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 500, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 510 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 6:
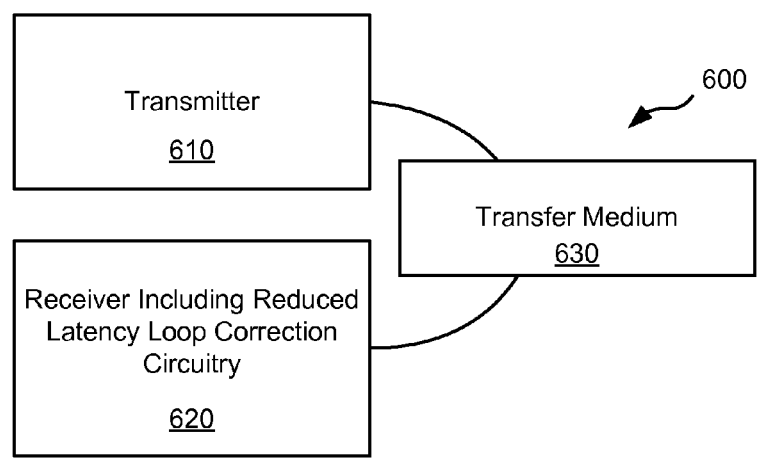
FIG. 6 depicts a wireless communication system including a receiver having reduced latency loop correction circuitry in accordance with various embodiments of the present invention.

Turning to FIG. 6, a wireless communication system 600 including a receiver 620 having reduced latency loop correction circuitry in accordance with various embodiments of the present invention. Communication system 600 includes a transmitter 610 that is operable to transmit encoded information via a transfer medium 630 as is known in the art. The encoded data is received from transfer medium 630 by receiver 620. Receiver 620 incorporates a reduced latency DC loop circuit. Such a reduced latency DC loop circuit may be implemented consistent with that described above in relation to FIGS. 1-3. In some cases, the reduced latency loop correction may be done consistent with the flow diagram discussed above in relation to FIG. 4.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing circuit comprising:

a data detector circuit operable to perform a first data detection process on a first signal derived from a data input to yield a detected output, and to provide a loop error as a difference between the detected output and the first signal;

a low latency detection circuit operable to perform a second data detection process on a second signal derived from the data input to yield a fast detector output, and to calculate a generated error as a difference between the fast detector output and the second signal; and an error calculation circuit operable to calculate an error value based at least in part on the generated error and the loop error.

2. The data processing system of claim 1, wherein the data processing system further comprises:

an equalizer circuit operable to equalized a third signal derived from the data input to yield an equalized output, wherein the first signal is derived from the equalized output, and wherein the second signal is selected from a group consisting of: the equalized output and the third signal.

3. The data processing system of claim 2, wherein the data processing system further comprises:

a summation circuit operable to subtract the error value from the data input to yield a corrected input; and an analog processing circuit operable to generate a series of digital values corresponding to the third signal from the corrected input.

4. The data processing system of claim 1, wherein the low latency detection circuit is an envelope detector circuit.

5. The data processing system of claim 1, wherein the error calculation circuit includes:
- a first delay circuit operable to delay the generated error to yield a first delayed output;
- a first summation circuit operable to add the loop error, the generated error, and a negative of the first delayed output to yield a first sum;
- a second delay circuit operable to delay an interim offset value to yield a second delayed output;
- a second summation circuit operable to subtract the second delayed output from an offset input derived from the first sum to yield a second sum; and
- a register operable to store the second sum as the interim offset value, wherein the error value is derived from the interim offset value.

6. The data processing system of claim 5, wherein the error calculation circuit further comprises:
- a multiplier circuit operable to multiply the first sum by a scalar value to yield the offset input.

7. The data processing system of claim 1, wherein the error calculation circuit includes:
- a first delay circuit operable to delay the generated error to yield a first delayed output;
- a first summation circuit operable to add the loop error, the generated error, and a negative of the first delayed output to yield a first sum;
- an absolute value circuit operable to generate an absolute value of the first SUM;
- a multiplier circuit operable to multiply the first sum by the absolute value of the first sum to yield a product;
- a second delay circuit operable to delay an interim offset value to yield a second delayed output;
- a second summation circuit operable to subtract the second delayed output from an offset input derived from the product to yield a second sum; and
- a register operable to store the second sum as the interim offset value, wherein the error value is derived from the interim offset value.

8. The data processing system of claim 7, wherein the multiplier circuit is a first multiplier circuit, and wherein the error calculation circuit further comprises:
- a second multiplier circuit operable to multiply the product by a scalar value to yield the offset input.

9. The data processing system of claim 7, wherein the error calculation circuit is further operable to scale a multiplier value by the product.

10. The data processing system of claim 1, wherein the error calculation circuit includes:
- a first absolute value circuit operable to generate an absolute value of the generated error;
- a first multiplier circuit operable to multiply the generated error by the absolute value of the generated error to yield a first product;
- a second absolute value circuit operable to generate an absolute value of the loop error;
- a second multiplier circuit operable to multiply the loop error by the absolute value of the loop error to yield a second product;
- a first delay circuit operable to delay the first product to yield a first delayed output;
- a first summation circuit operable to add the first product, the second product, and a negative of the first delayed output to yield a first sum;
- a second delay circuit operable to delay an interim offset value to yield a second delayed output;
- a second summation circuit operable to subtract the second delayed output from an offset input derived from the first sum to yield a second sum; and
- a register operable to store the second sum as the interim offset value, wherein the error value is derived from the interim offset value.

11. The data processing system of claim 10, wherein the error calculation circuit further comprises:
- a third multiplier circuit operable to multiply the first sum product by a scalar value to yield the offset input.

12. The data processing system of claim 1, wherein the data processing system is implemented as part of an integrated circuit.

13. The data processing system of claim 1, wherein the data processing system is incorporated in a device selected from a group consisting of: a storage device, and a data transmission device.

14. A storage device, the storage device comprising:
- a storage medium operable to maintain a data set;
- a read/write head assembly operable to sense the data set on the storage medium and to provide an analog output corresponding to the data set;
- an amplifier circuit operable to amplify the analog output to yield a data input;
- a summation circuit operable to subtract an error value from the data input to yield a corrected input;
- a data detector circuit operable to perform a data detection process on a first signal derived from the corrected input to yield a detected output, and to provide a loop error as a difference between the detected output and the first signal;
- a low latency detection circuit operable to process a second signal derived from the corrected input to yield a fast detector output, and to provide a generated error as a difference between the fast detector output and the second signal; and
- an error calculation circuit operable to calculate an error offset value based at least in part on the generated error and the loop error.

15. The storage device of claim 14, wherein the storage device further comprises:
- an equalizer circuit operable to equalized a third signal derived from the data input to yield an equalized output, wherein the first signal is derived from the equalized output, and wherein the second signal is selected from a group consisting of: the equalized output and the third signal.

16. The storage device of claim 14, wherein the error calculation circuit includes:
- a first delay circuit operable to delay the generated error to yield a first delayed output;
- a first summation circuit operable to add the loop error, the generated error, and a negative of the first delayed output to yield a first sum;
- a multiplier circuit operable to multiply the first sum by a scalar value to yield an offset input;
- a second delay circuit operable to delay an interim offset value to yield a second delayed output;
- a second summation circuit operable to subtract the second delayed output from the offset input to yield a second sum; and
- a register operable to store the second sum as the interim offset value, wherein the error value is derived from the interim offset value.

17. The storage device of claim 14, wherein the error calculation circuit includes:

a first delay circuit operable to delay the generated error to yield a first delayed output;

a first summation circuit operable to add the loop error, the generated error, and a negative of the first delayed output to yield a first sum;

an absolute value circuit operable to generate an absolute value of the first SUM;

a multiplier circuit operable to multiply the first sum by the absolute value of the first sum and a scalar value to yield an offset input;

a second delay circuit operable to delay an interim offset value to yield a second delayed output;

a second summation circuit operable to subtract the second delayed output from the offset input derived from the product to yield a second sum; and a register operable to store the second sum as the interim offset value, wherein the error value is derived from the interim offset value.

18. The storage device of claim 14, wherein the error calculation circuit includes:

a first absolute value circuit operable to generate an absolute value of the generated error;

a first multiplier circuit operable to multiply the generated error by the absolute value of the generated error to yield a first product;

a second absolute value circuit operable to generate an absolute value of the loop error;

a second multiplier circuit operable to multiply the loop error by the absolute value of the loop error to yield a second product;

a first delay circuit operable to delay the first product to yield a first delayed output;

a first summation circuit operable to add the first product, the second product, and a negative of the first delayed output to yield a first sum;

a second delay circuit operable to delay an interim offset value to yield a second delayed output;

a second summation circuit operable to subtract the second delayed output from an offset input derived from the first sum to yield a second sum; and a register operable to store the second sum as the interim offset value, wherein the error value is derived from the interim offset value.

19. A method for low latency loop correction, the method comprising:

receiving a data input;

applying a first data detection algorithm to a first signal derived from a data input to yield a detected output;

calculating a difference between the first signal and the detected output to yield a loop error;

applying a second data detection algorithm to a second signal derived from the data input to yield a fast detector output; wherein a latency of the second data detection algorithm is less than a latency of the first data detection algorithm;

calculating a difference between the second signal and the fast detector output to yield a generated error; and calculating an error value based at least in part on the generated error and the loop error.

20. The method of claim 19, wherein the method further comprises:

equalizing a third signal derived from the data input to yield an equalized output, wherein the first signal is derived from the equalized output, and wherein the second signal is selected from a group consisting of: the equalized output and the third signal;

subtracting the error value from the data input to yield a corrected input; and processing the corrected input to generate the third signal.

* * * * *